United States Patent [19]
Cabot et al.

[11] 4,302,738
[45] Nov. 24, 1981

[54] NOISE REJECTION CIRCUITRY FOR A FREQUENCY DISCRIMINATOR

[75] Inventors: Richard C. Cabot; Bruce E. Hofer, both of Beaverton, Oreg.

[73] Assignee: Tektronix, Inc., Beaverton, Oreg.

[21] Appl. No.: 139,938

[22] Filed: Apr. 11, 1980

[51] Int. Cl.³ .................. H03H 7/02; H03H 21/00
[52] U.S. Cl. .................. 333/174; 328/138; 333/17 R
[58] Field of Search .............. 333/174, 176, 17 R, 333/17 L, 14, 18; 328/167, 137, 140, 141, 138; 329/131, 136; 324/77 R, 77 A, 77 B, 78 N; 330/124 R, 132, 207 R, 291, 294, 302, 303; 179/1 P, 1 D

[56] References Cited
U.S. PATENT DOCUMENTS

| | | | |
|---|---|---|---|
| 2,763,840 | 9/1956 | Pfleger | 333/17 L |
| 3,314,026 | 4/1967 | Maynard | 333/17 |
| 3,555,439 | 1/1971 | Starr et al. | 324/78 R |

Primary Examiner—Marvin L. Nussbaum

[57] ABSTRACT

A noise reducing circuit for a frequency discriminator is disclosed for providing a frequency discriminator with reduced sensitivity to noise. Reducing the sensitivity to noise allows certain distortion measurements, such as the well-known SINAD test for broadcast receivers, to be made in the presence of high noise levels.

8 Claims, 2 Drawing Figures

NOISE REJECTION CIRCUITRY FOR A FREQUENCY DISCRIMINATOR

BACKGROUND OF THE INVENTION

The present invention relates to frequency discriminators and more particularly to means for improving the noise rejection capability of frequency discriminators used in certain distortion analyzers.

Various methods have been devised for analyzing the distortion of an audio frequency system. One of these tests is the total harmonic distortion plus noise test. Total harmonic distortion plus noise is measured by first applying a pure sinewave to the input of the system to be tested. The system output is then applied to a notch filter to remove the fundamental frequency. The remaining signals representing the distortion and noise introduced by the system under test are measured and displayed as a percentage of the total signal.

Heretofore distortion analyzers designed to perform the above measurements had only partly automatic tuning at best. What is required is a frequency discriminator which measures the frequency of the input signal and tunes the notch filter to the proper band. Also, the frequency discriminator must be immune to high levels of noise such as those present in SINAD testing. The term SINAD is an abbreviation for "signal+noise+distortion to noise+distortion ratio" expressed in db. The test procedure for SINAD may be found in EIA STANDARD RS-204-A "Minimum Standards for Land Mobile Communication FM or PM Receivers, 25-470 MHz", Electronic Industries Association, copyright 1972.

SUMMARY OF THE INVENTION

According to the present invention a frequency discriminator is provided with reduced sensitivity to noise through the use of a self-filtering action. This reduced sensitivity to noise allows certain distortion measurements to be made in the presence of high noise or under weak signal conditions. In other words, once the frequency discriminator is locked to the input signal it will remain locked regardless of noise level.

A notched version of the input signal from a notch filter is subtracted from the noisy input signal and coupled to the frequency discriminator. The output of the frequency discriminator is then utilized to tune the notch filter. In another embodiment of the present invention, a bandpassed version of the input signal is mixed with the noisy input signal to obtain the same result.

It is therefore an object of the present invention to provide a frequency discriminator which is immune to high noise levels.

It is another object of the present invention to enable a distortion analyzer to make a total harmonic distortion plus noise test in the presence of high noise levels.

It is still another object of the present invention to provide a frequency discriminator which remains locked to the input signal in the presence of a high level of noise.

The foregoing and numerous other objects, advantages, and inherent functions of the present invention will become apparent as the same is more fully understood from the following description. It is to be understood, however, that the embodiments described are not intended to be exhausting nor limiting of the invention and are presented as an example only.

DETAILED DESCRIPTION OF THE PREFERRED EMBODIMENT

Figure 1:
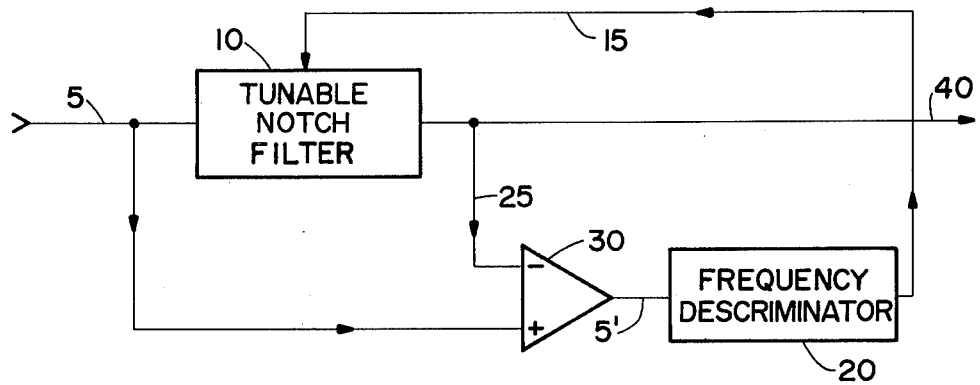
FIG. 1 is a block diagram of a preferred embodiment of the present invention.
Figure 1:
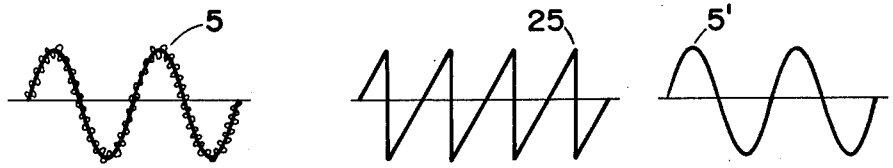

Referring now to the drawings, particularly FIG. 1, therein is illustrated a block diagram of a preferred embodiment of the present invention.

An input signal 5 enters the circuit and is coupled to a tunable notch filter 10 which is an electronically tunable notch filter. Such filters are well known in the art and will not be described in detail. Those requiring more detailed information are referred to in John Markus, *Guidebook of Electronic Circuits*, copyright 1974, McGraw-Hill, Inc. The notch frequency of filter 10 is varied according to a control voltage 15 applied to a control input of the filter.

Input signal 5 is also coupled to the noninverting input of a differential amplifier 30. The output signal from notch filter 10 is input to the inverting input terminal of differential amplifier 30. The output signal of amplifier 30 is fed to frequency discriminator 20 which is of conventional design. A frequency discriminator is a device in which amplitude variations are derived in response to frequency variations. These amplitude variations are coupled back to the control node of notch filter 10 as the previously mentioned control voltage 15.

By way of operation, initially a pure signal (no noise) is applied to tunable notch filter 10 and the noninverting input of differential amplifier 30. Notch filter 10 is initially tuned to reject the frequency of the input signal. The output of notch filter 10 is, thus, zero. The output of amplifier 30 is the pure input signal and the output of discriminator 20 is a control voltage 15 representative of any variations in the frequency of the pure input signal. This control voltage then varies the tuning of notch filter 10. Thus, the output of frequency discriminator 20 is locked to the input signal.

However, the input signal 5 may contain a large amount of noise. This noise may be added to the pure signal either by extraneous external causes or by design as in a SINAD test. Whatever the source of noise, circuit operation in the presence of noise is as follows. The noisy input signal 5 is simultaneously coupled to tunable notch filter 10 and the noninverting input of differential amplifier 30. Since notch filter 10 is tuned to the pure version of signal 5, its output will be residual noise signal 25 which is fed to the inverting input of differential amplifier 30. Residual noise signal 25 is subtracted from noisy signal 5 in differential amplifier 30 to produce a pure version of input signal 5. This signal is applied to frequency discriminator 20 where any variation in the frequency thereof causes a variation in control voltage 15 and thereby varies the notch frequency of filter 10.

Figure 2:
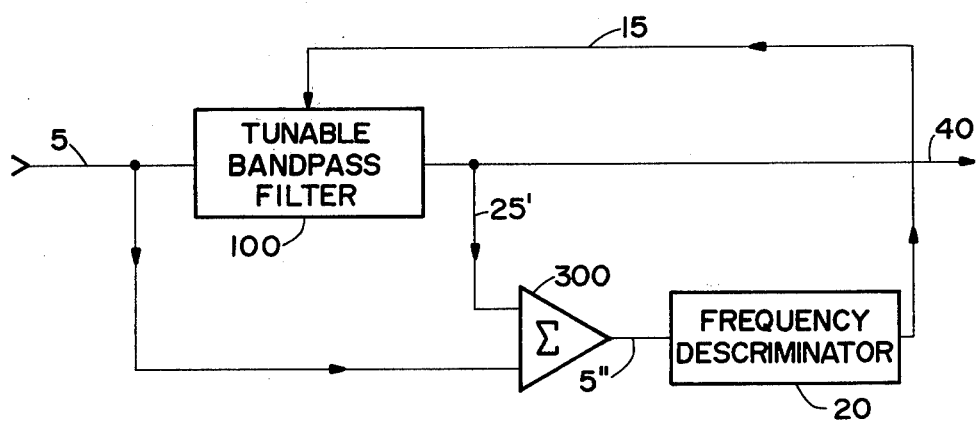
FIG. 2 is an alternative embodiment of the present invention.
Figure 2:
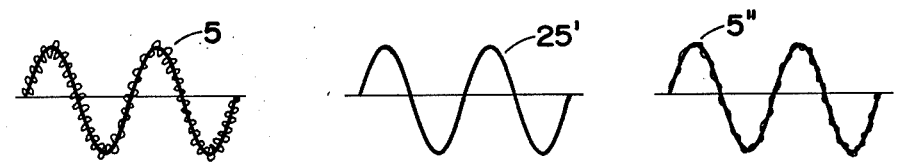

It can be seen from the above that the applicants have provided a new and novel apparatus for accomplishing frequency discrimination in the presence of high noise levels. Referring now to FIG. 2, therein is illustrated an alternative embodiment of the present invention.

The input enters the circuit and is coupled to a tunable bandpass filter 100 which is an electronically tunable bandpass filter. Such filters are well known in the art and will not be described in detail here. Those requiring more detailed information are referred to the previously mentioned *Guidebook of Electronic Circuits*. The bandpass of filter 100 is varied according to a control voltage 15 applied to a control terminal of the filter.

Input signal 5 is also coupled to one input of summing amplifier 300. The output of bandpass filter 100 is the input to summing amplifier 300 and output of summing amplifier 300 is coupled to a frequency discriminator 20. Frequency discriminator 20 is conventional in design and will not be described in detail here. The output of frequency discriminator 20 is coupled back to the control port of tunable bandpass filter 100 as control voltage 15.

By way of operation, initially a pure input signal is applied to tunable bandpass filter 100 and one input of summing amplifier 300. Bandpass filter 100 is initially tuned to pass this input signal. The output of bandpass filter 100 is, therefore, the pure input signal. This signal is summed with itself in summing amplifier 300. Thus, the output of summing amplifier is the pure input signal which produces amplitude variations at the output of frequency discriminator 20 according to any changes in the frequency of the input signal. These amplitude variations are used to tune bandpass filter 100 to the input frequency. The output of frequency discriminator 20 is now effectively locked to the input signal.

Circuit operation in the presence of noise is as follows. The noisy input signal 5 is simultaneously coupled to tunable bandpass filter 100. Since bandpass filter 100 is tuned to pass the pure version of input signal 5, its output will be signal 25' which is input signal 5 minus any out-of-band noise. Signal 25' is coupled to one input of summing amplifier 300 where it is mixed with the noisy input signal 5. The circuit of FIG. 2 depicts an embodiment wherein signal 25' and signal 5 are mixed in equal amounts; therefore, the output of summing amplifier will have a noise content of approximately one-half of that of signal 5. This mixing ratio may be changed to suit the particular application. The input to discriminator 20, signal 5'', now has very little noise content and the discriminator will remain locked to the input signal.

It may be observed that the foregoing specification has not been burdened by the inclusion of large amounts of detail and specific information relative to such matters as timing and biasing since they are believed to be within the skill of the art. It should be noted that the particular embodiments of the invention which are shown and described herein are intended to be illustrative and not restrictive of the invention. Therefore, the appended claims are intended to cover all modifications which fall within the scope of the foregoing specification.

We claim as our invention:

1. A frequency discriminating system comprising:
   a tunable notch filter having an input terminal, an output terminal, and a control terminal for receiving and filtering an input signal;
   subtracting means for receiving the output of said tunable notch filter and said input signal and subtracting one from the other; and
   frequency discriminating means connected to receive the output of said subtracting means for producing output amplitude variations in response to input frequency variations, said output amplitude variations being coupled to said control terminal of said tunable notch filter for tuning the notch frequency thereof.

2. The system according to claim 1 wherein said subtracting means comprises a differential amplifier.

3. A frequency discriminating system comprising:
   a tunable bandpass filter having an input terminal, an output terminal, and a control terminal for receiving and filtering an input signal;
   summing means for receiving the output of said tunable bandpass filter and said input signal and summing them together; and
   frequency descriminating means connected to receive the output of said summing means for producing output variations in response to input frequency variations, said output amplitude variations being coupled to said control terminal of tunable bandpass filter for tuning the bandpass thereof.

4. The system according to claim 3 wherein said summing means comprises a summing amplifier.

5. A noise reducer for a frequency discriminator which produces output amplitude variations in response to the frequency variations of an input signal, the noise reducer comprising:
   a tunable notch filter having an input terminal, an output terminal, and a control terminal, for receiving and filtering the input signal, said control terminal being coupled to receive the output amplitude variations of the frequency discriminator; and
   substracting means for receiving and subtracting the output of said notch filter from the input signal, the output of said subtracting means being connected to the input terminal of the frequency discriminator.

6. The noise reducer according to claim 5 wherein said subtracting means comprises a differential amplifier.

7. A noise reducer for a frequency discriminator which produces output amplitude variations in response to the frequency variations of an input signal, the noise reducer comprising:
   a tunable bandpass filter having an input terminal, an output terminal, and a control terminal, for receiving and filtering the input signal, said control terminal being coupled to receive the output amplitude variations of the frequency discriminator; and
   summing means for receiving and adding the output of said bandpass filter to the input signal, the output of said summing means being connected to the input terminal of the frequency discriminator.

8. The noise reducer according to claim 7 wherein said summing means comprises a summing amplifier.

* * * * *